United States Patent [19]
Estakhri et al.

[11] Patent Number: 6,141,249
[45] Date of Patent: Oct. 31, 2000

[54] ORGANIZATION OF BLOCKS WITHIN A NONVOLATILE MEMORY UNIT TO EFFECTIVELY DECREASE SECTOR WRITE OPERATION TIME

[75] Inventors: Petro Estakhri, Pleasanton; Berhanu Iman, Sunnyvale, both of Calif.

[73] Assignee: Lexar Media, Inc., Fremont, Calif.

[21] Appl. No.: 09/389,994

[22] Filed: Sep. 3, 1999

Related U.S. Application Data

[63] Continuation-in-part of application No. 09/283,728, Apr. 1, 1999, Pat. No. 6,034,897.

[51] Int. Cl.$^7$ .................................................. G11C 16/04
[52] U.S. Cl. ............................. 365/185.11; 365/185.12; 365/230.03
[58] Field of Search .......................... 365/185.11, 185.12, 365/230.03, 230.04, 230.09

[56] References Cited

U.S. PATENT DOCUMENTS

| | | | |
|---|---|---|---|
| 4,210,959 | 7/1980 | Wozniak | 364/200 |
| 4,355,376 | 10/1982 | Gould | 365/230 |
| 4,405,952 | 9/1983 | Slakmon | 360/49 |

(List continued on next page.)

FOREIGN PATENT DOCUMENTS

| | | | |
|---|---|---|---|
| 0 557 723 | 1/1987 | Australia | G11C 5/00 |
| 0 220 718 A2 | 5/1987 | European Pat. Off. | G06F 15/40 |
| 0 243 503 A1 | 11/1987 | European Pat. Off. | G11B 20/10 |
| 0 424 191 A2 | 4/1991 | European Pat. Off. | G06F 11/00 |
| 0 489 204 A1 | 6/1992 | European Pat. Off. | G11C 16/06 |
| 0 522 780 A2 | 1/1993 | European Pat. Off. | G06F 3/06 |
| 0 544 252 A2 | 6/1993 | European Pat. Off. | G11C 16/06 |
| 0 686 976 A2 | 12/1995 | European Pat. Off. | G11C 16/06 |
| 93 01908 | 8/1993 | France | G06F 12/02 |
| 59-45695 | 9/1982 | Japan | G11C 17/00 |
| 58-215794 | 12/1983 | Japan | G11C 17/00 |
| 58-215795 | 12/1983 | Japan | G11C 17/00 |
| 59-162695 | 9/1984 | Japan | G11C 17/00 |
| 60-212900 | 10/1985 | Japan | G11C 29/00 |
| 61-96598 | 5/1986 | Japan | G11C 17/00 |
| 62-283496 | 12/1987 | Japan | G11C 17/00 |
| 62-283497 | 12/1987 | Japan | G11C 17/00 |
| 63-183700 | 7/1988 | Japan | G11C 17/00 |
| 4-332999 | 11/1992 | Japan | G11C 29/00 |
| 84/00628 | 2/1984 | WIPO | G06F 11/20 |

OTHER PUBLICATIONS

Book—Computer Architecture and Parallel Processing, Kai Hwang & Faye A. Briggs, McGraw–Hill Book Co., © 1984, p. 64.

Magazine—"State of the Art: Magnetic VS. Optical Store Data in a Flash", by Walter Lahti and Dean McCarron, Byte magazine dated Nov. 1, 1990, 311, vol. 15, No. 12.

Magazine—Technology Updates, Integrated Circuits, "1–Mbit flash memories seek their role in system design", Ron Wilson, Senior Editor, Computer Design magazine 28 (1989) Mar. 1, No. 5, Tulsa OK, US, pp. 30 and 32.

1992 Symposium of VLSI Circuits Digest of Technical Papers, "EEPROM for Solid State Disk Applications", S. Mehoura et al., SunDisk Corporation, Santa Clara, CA. R. W. Gregor et al., AT&T Bell Laboratories, Allentown, PA. pp. 24 and 25.

*Primary Examiner*—Son T. Dinh
*Attorney, Agent, or Firm*—Law Office of Imam

[57] ABSTRACT

An embodiment of the present invention includes a nonvolatile memory system for storing sector information in storage locations within nonvolatile memory organized into blocks, a plurality of blocks defining a super block and each block having a predetermined plurality of sectors. The nonvolatile memory system includes a controller for shifting sector information to a first and a second block of a particular super block and writing sector information to the first block of the particular super block, wherein shifting to the second block occurs entirely during the writing to the first block thereby decreasing the time required to perform write operations to blocks and increasing overall system performance.

8 Claims, 8 Drawing Sheets

U.S. PATENT DOCUMENTS

| | | | |
|---|---|---|---|
| 4,450,559 | 5/1984 | Bond et al. | 371/10 |
| 4,456,971 | 6/1984 | Fukuda et al. | 364/900 |
| 4,498,146 | 2/1985 | Martinez | 364/900 |
| 4,525,839 | 7/1985 | Nozawa et al. | 371/38 |
| 4,616,311 | 10/1986 | Sato | 364/200 |
| 4,654,847 | 3/1987 | Dutton | 371/10 |
| 4,710,871 | 12/1987 | Belknap et al. | 364/200 |
| 4,746,998 | 5/1988 | Robinson et al. | 360/72.1 |
| 4,748,320 | 5/1988 | Yorimoto et al. | 235/492 |
| 4,757,474 | 7/1988 | Fukushi et al. | 365/189 |
| 4,774,700 | 9/1988 | Satoh et al. | 369/54 |
| 4,800,520 | 1/1989 | Iijima | 364/900 |
| 4,896,262 | 1/1990 | Wayama et al. | 364/200 |
| 4,914,529 | 4/1990 | Bonke | 360/48 |
| 4,920,518 | 4/1990 | Nakamura et al. | 365/228 |
| 4,924,331 | 5/1990 | Robinson et al. | 360/72.1 |
| 4,953,122 | 8/1990 | Williams | 364/900 |
| 5,070,474 | 12/1991 | Tuma et al. | 395/500 |
| 5,168,465 | 12/1992 | Harari | 257/320 |
| 5,198,380 | 3/1993 | Harari | 437/43 |
| 5,200,959 | 4/1993 | Gross et al. | 371/21.6 |
| 5,226,168 | 7/1993 | Kobayashi et al. | 395/800 |
| 5,268,318 | 12/1993 | Harari | 437/43 |
| 5,268,870 | 12/1993 | Harari | 365/218 |
| 5,270,979 | 12/1993 | Harari et al. | 365/218 |
| 5,293,560 | 3/1994 | Harari | 365/185 |
| 5,297,148 | 3/1994 | Harari et al. | 371/10.2 |
| 5,303,198 | 4/1994 | Adachi et al. | 365/218 |
| 5,315,541 | 5/1994 | Harari et al. | 365/63 |
| 5,337,275 | 8/1994 | Garner | 365/189.01 |
| 5,341,330 | 8/1994 | Wells et al. | 365/185 |
| 5,341,339 | 8/1994 | Wells | 365/218 |
| 5,353,256 | 10/1994 | Fandrich et al. | 365/230.03 |
| 5,357,475 | 10/1994 | Hasbun et al. | 365/218 |
| 5,369,615 | 11/1994 | Harari et al. | 365/218 |
| 5,388,083 | 2/1995 | Assar et al. | 365/218 |
| 5,396,468 | 3/1995 | Harari et al. | 365/218 |
| 5,418,752 | 5/1995 | Harari et al. | 365/218 |
| 5,422,842 | 6/1995 | Cernea et al. | 365/185 |
| 5,428,621 | 6/1995 | Mehrotra et al. | 371/21.4 |
| 5,430,859 | 7/1995 | Norman et al. | 395/425 |
| 5,434,825 | 7/1995 | Harari | 365/185 |
| 5,438,573 | 8/1995 | Mangan et al. | 371/10.3 |
| 5,471,478 | 11/1995 | Mangan et al. | 371/10.3 |
| 5,479,638 | 12/1995 | Assar et al. | 395/430 |
| 5,485,595 | 1/1996 | Assar et al. | 395/430 |
| 5,495,442 | 2/1996 | Cernea et al. | 365/185.03 |
| 5,504,760 | 4/1996 | Harari et al. | 371/40.1 |
| 5,508,971 | 4/1996 | Cernea et al. | 365/185.23 |
| 5,524,230 | 6/1996 | Sakaue et al. | 395/430 |
| 5,532,962 | 7/1996 | Auclair et al. | 365/201 |
| 5,532,964 | 7/1996 | Cernea et al. | 365/189.09 |
| 5,534,456 | 7/1996 | Yuan et al. | 437/43 |
| 5,535,328 | 7/1996 | Harari et al. | 395/182.05 |
| 5,544,118 | 8/1996 | Harari | 365/218 |
| 5,544,356 | 8/1996 | Robinson et al. | 395/600 |
| 5,554,553 | 9/1996 | Harari | 437/43 |
| 5,563,825 | 10/1996 | Cernea et al. | 365/185.18 |
| 5,566,314 | 10/1996 | DeMarco et al. | 395/430 |
| 5,568,439 | 10/1996 | Harari | 365/218 |
| 5,583,812 | 12/1996 | Harari | 365/185.33 |
| 5,592,420 | 1/1997 | Cernea et al. | 365/185.18 |
| 5,642,312 | 6/1997 | Harari | 365/185.33 |
| 5,663,901 | 9/1997 | Wallace et al. | 365/52 |
| 5,693,570 | 12/1997 | Cernea et al. | 437/205 |
| 5,712,819 | 1/1998 | Harari | 365/185.29 |
| 5,719,808 | 2/1998 | Harari et al. | 365/185.33 |
| 5,778,418 | 7/1998 | Auclair et al. | 711/101 |

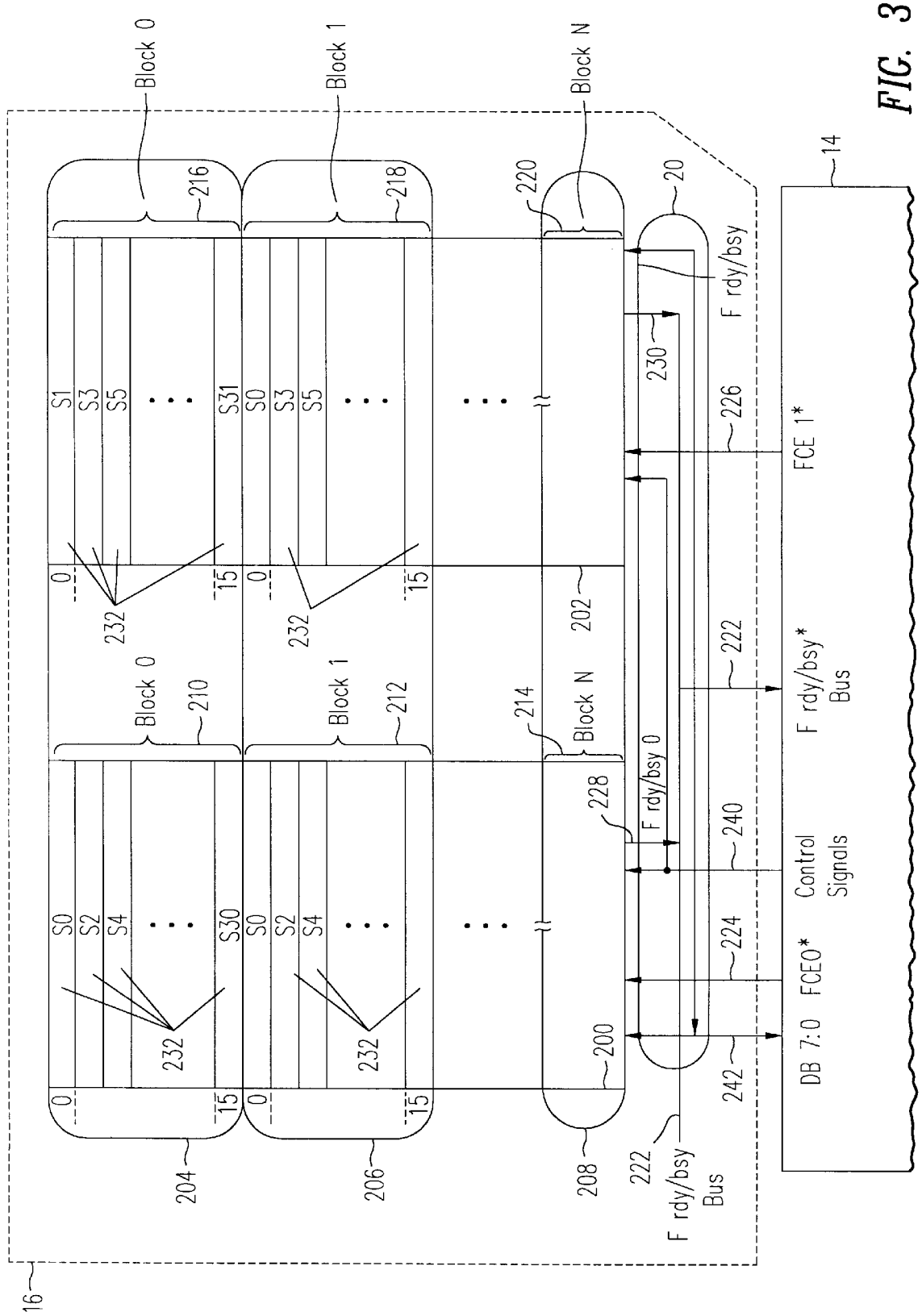

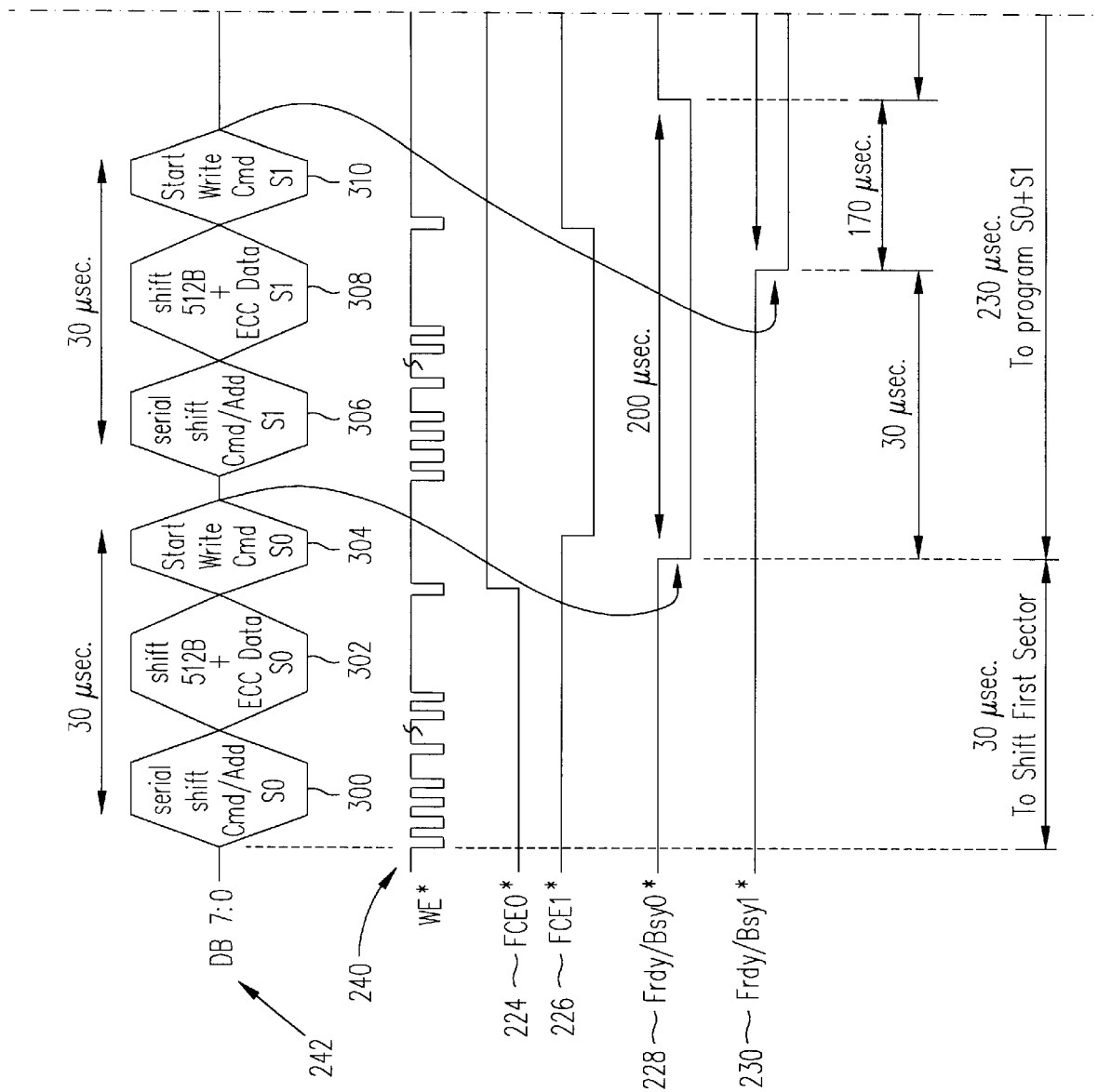
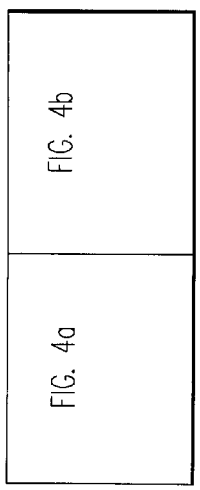
FIG. 4a
Key To FIG. 4

Key To

ORGANIZATION OF BLOCKS WITHIN A NONVOLATILE MEMORY UNIT TO EFFECTIVELY DECREASE SECTOR WRITE OPERATION TIME

CROSS REFERENCE TO RELATED APPLICATIONS

This application is a continuation-in-part of a previously-filed U.S. patent application, entitled "SPACE MANAGEMENT FOR MANAGING HIGH CAPACITY NONVOLATILE MEMORY", application Ser. No. 09/283,728, filed on Apr. 1, 1999, now U.S. Pat. No. 6,034,897 the inventors of which are Petro Estakhri, Berhanu Iman and Min Guo and another previously-filed U.S. patent application, entitled "MOVING SECTORS WITHIN A BLOCK OF INFORMATION IN A FLASH MEMORY MASS STORAGE ARCHITECTURE", application Ser. No. 09/264,340, filed on Mar. 8, 1999, the inventors of which are Petro Estakhri, Berhanu Iman and Ali Ganjuei, which is continuation of U.S. Pat. No. 5,907,856, issued on May 25, 1999 and entitled "MOVING SECTORS WITHIN A BLOCK OF INFORMATION IN A FLASH MEMORY MASS STORAGE ARCHITECTURE" and another previously-filed U.S. patent application, entitled "INCREASING MEMORY PERFORMANCE IN FLASH MEMORY DEVICES BY PERFORMING SIMULTANEOUS WRITE OPERATION TO MULTIPLE DEVICES", application Ser. No. 09/030,697, filed on Feb. 25, 1998, the inventors of which are Petro Estakhri and Berhanu Iman. The disclosure of all of these patent documents is incorporated by reference herein as though set forth in full.

BACKGROUND OF THE INVENTION

1. Field of the Invention

This invention relates generally to the field of digital storage systems employing non-volatile memory devices such as flash memory and particularly to decreasing the time associated with writing information to the nonvolatile memory devices thereby increasing overall system performance.

2. Description of the Prior Art

Recently, solid state memory has gained popularity for use in replacing mass storage units in various technology areas such as computers, digital cameras, modems and the like. For example, in digital cameras, the use of solid state memory, such as flash memory, replaces conventional films.

Flash memory is generally provided in the form of semiconductor devices (or chips) with each device made of a large number of transistor memory cells and each cell being individually programmable. The programming (or writing) and erasing of such a memory cell is limited to a finite number of erase-write cycles, which basically determines the lifetime of the device. Furthermore, an inherent characteristic of flash memory cells is that they must be erased and verified for successful erase prior to being programmed.

Accordingly, use of flash memory entails erasing the area of memory that once contained information every time prior to re-programming the same area. In a flash memory device, write and erase cycles are generally time-consuming thereby significantly reducing the performance of a system utilizing flash memory as its mass storage.

In applications employing flash memory devices, such as personal computers and digital cameras, a host writes and reads information to the flash memory devices through a controller device, which is commonly in the form of a semiconductor device. Such information is organized in sectors with each sector including user data information and overhead information, collectively referred to as sector information. The user data portion of a sector is typically 512 bytes in length although other size sectors may be similarly employed. The controller, upon receiving sector information from the host, during a host-commanded write operation, writes sector information to the flash memory devices in accordance with a predetermined sector organization. While the host may be accessing multiple sectors, each sector is written to the flash devices one at a time.

In storing and/or retrieving a data file (data files may be any computer files including commercial software, user program, word processor software document, spread sheet file and the like), a computer (or host) system provides what is referred to as the logical block address indicating the location of where the host believes the data file to exist within the mass storage. The host-provided address may be in the form of cylinder, head and sector (CHS), which is converted to a logical block address format upon receipt by the controller. The same applies to digital camera applications. The controller then translates the logical block address (LBA) into a virtual logical block address (VLBA) and uses the latter to look-up a virtual physical block address (VPBA) within a space manager look-up-table (LUT). Upon retrieving the VPBA, the controller uses the same to access the data file within flash memory. The data file is stored in blocks within the nonvolatile memory with each block having a predetermined number of sectors. For example, a block comprises 16 sectors and each sector includes 512 bytes of user data information and various bytes of extension or overhead information, such as flags, ECC and the like. The VPBA is translated into a PBA for locating a particular block within the nonvolatile memory.

Each time a data file is changed, the latest version of the file is stored in an available (or 'unused') location within the flash memory that is identified by a new physical location (or new PBA). Upon using much of the free (or available) locations within the flash memory for updated files, an erase operation may be needed to make available 'old' locations for storage of additional information. Since erase operations are time-consuming (as are write operations), there is a tradeoff as to the frequency of performing erase operations to the time expended for searching for free locations within the flash memory as more and more locations are used prior to the next erase operation. Efforts are continuously made to try and find ways of improving system performance by reducing the number of erase operations or reducing the search time associated with locating blocks of information within the nonvolatile memory.

Information in the nonvolatile memory or flash memory is stored under the direction of the controller and it is done so in the form of sectors and a number of sectors define a block. A block may include 16, 32 or other number of sectors. But once blocks are determined to include a predetermined number of sectors, this determined size defines each block. Thus, information that is stored in nonvolatile memory is organized in blocks and each block is uniquely addressable by the controller. Each block is further comprised of multiple sectors with each sector being defined by 512 bytes plus additional storage space for storing non-data information, such as flags, address and error correction code (ECC) information. Although a sector may have data storage spaces other than 512 bytes. In some prior art systems, during an erase operation, an entire block is erased whereas in other prior art systems, the sector may be erased. Each sector within a block is uniquely addressable for reading and writing information from and to the nonvolatile memory. A unique value is maintained within each block that contains sector information as a Virtual Logical Block Address (VLBA) for use in reconstructing the addressing or mapping information associated with the nonvolatile memory during power-up. As is well known by those skilled in the art, when power is lost, information maintained in volatile memory, such as Random Access Memory (RAM) is lost. The mapping information regarding the block information stored within the nonvolatile memory is generally maintained in a look-up-table (LUT) within volatile memory, as will now be further described.

Currently, in computers wherein large files such as commercial software and user programs are stored within flash memory and in digital cameras wherein large picture files are stored within flash devices, the files are written one sector at a time within flash. Due to the latency associated with each write operation, the performance of these systems when storing large quantities of information is limited. Some of the steps associated with a write operation performed on a particular sector is to shift a write command into the flash (memory) device being written, shift sector information into the flash device being written and then start to write (or program) the write command followed by the sector information into the block within which the sector information is to be stored. Generally, for a 512-byte sector, 30 μsec. is needed to shift sector information into the flash device. 200 μsec. is needed to actually write the sector information into the flash device. One of the limitations of prior art systems is that one sector is written at-a-time, thus, more than 230 μsec. are needed to write each sector. Where each block contains 16 sectors that must be written thereto, more than 16×230 μsec. is necessary to write all of the sectors, which considerably slows system performance when writing many sectors.

One way prior art systems have attempted to overcome this problem is by addressing two sectors at-a-time to allow for writing of two sectors at-a-time. While these prior art techniques decrease the actual sector information write time by a factor of two, there is still twice as much time needed to shift two sectors worth of sector information. In the example provided hereinabove, 200 μsec. (as opposed to 400 μsec.) is required to perform the actual writing of 1024 bytes of sector information, however, 2×30 μsec. or 60 μsec. is required to shift 1024 bytes of sector information. Thus, to write two sectors having 512 bytes of user data, a total of approximately 260 μsec is required. To help in understanding such prior art systems, an example is provided by reference to FIGS. 1 and 1a.

In FIG. 1, a prior art digital storage system 600 is shown to include a flash device 602 and a flash device 604. Each flash device is organized into blocks of information starting from Block 0 and continuing in sequential order to Block N (N being an integer number). Two blocks in like locations within the flash devices are used to write 32 sectors of information as each block of a flash device, in this example, includes 16 sectors. The sectors are numbered with even sectors being stored in flash device 602 and odd sectors being stored in flash device 604 although this is an arbitrary design choice and the opposite may be done. The sectors are numbered so as include 32 sectors within a two-block location distributed over two flash devices. Moreover, the numbering of the sectors causes switching between the flash devices in that, for example, the first sector, S0, appears in the first sector storage location of the first block, Block 0, of the flash device 602, the second sector, S1, appears in the first sector storage location of the first block, Block 0, of the flash device 604, the third sector, S2, appears in the second storage location of the first block, Block 0, of the flash device 602, the fourth sector, S3, appears in the second storage location of the first block, Block 0, of the flash device 604.

The reason for the even and odd numbering of the sectors between the two blocks of each of the flash devices is to enable loading of sector information in-parallel using a data bus, DB7:0 616, for coupling sector information to and from the flash deice 602 and another data bus, DB15:7 624 for coupling sector information to and from the flash device 604. A FCE0* signal 620 enables or selects the flash devices for shifting command/address and sector data and overhead information therein when active. The signal 620, in this example, is an active low signal.

FIG. 1a is a timing diagram of the signals depicted in the prior art FIG. 1 for use in explaining the operation of the latter. In FIG. 1a, the data bus DB15:0 is effectively a combination of the busses 616 and 624 and the WE* signal is one of the signals included in the control signals 622. When low, the WE* signal causes shifting of information into the flash devices. Initially, command and address information for sectors S0 and S1 is shifted into the flash devices. Next, sector user data and ECC information is shifted into the flash devices. Flash device 602 receives 512 bytes of data through the 616 bus and flash device 604 recevies 512 bytes of data through the 624 bus. Upon completion of shifting of all of the sector information, the controller starts the write operation, which causes the Frdy/Bsy* signal 618 to be activated (goes from a high state to a low state). Serial shifting of the command/address information and shifting of the sector information and the start of the write command consume approximately 30 μsec. in the case where each sector includes 512 bytes of user data. When the Frdy/Bsy* signal 618 goes low, approximately 200 μsec. thereafter, the writing (or programming) of sector information (user data and ECC) is completed for a sector having 512 bytes. Actually, in this case, in 200 μsec., 512 words (each word being two bytes) is programmed because the two busses 616 and 624 couple information to the flash devices 602 and 604, respectively and in-parallel. Thus, the entire write operation takes approximately 230 μsec. to complete. Upon completion of writing to sectors S0 and S1, the same process takes place for programming sectors S2 and S3 followed by programming of S4 and S5.

Some of the limitations with the prior art technique that was just discussed and described in FIGS. 1 and 1a are that there are more physical input/output pins required on the controller device. Specifically, due to having two data busses, 616 and 624, there are twice as many data bus lines necessary. In fact, if this prior art technique was to be used for programming more sectors in parallel and thus having additional flash devices configured in-parallel, the requirement for added data busses would increase and ultimately the number of controller pins would be impractical. Just as an example, to have four flash devices in-parallel where four sectors may be programmed in parallel, there would be an additional 16-number of pins needed on the controller device (for 16 additional data bus signals totaling 32 signals). This clearly increases manufacturing costs related to the controller device and may lead to a larger device that additionally drives costs higher.

Another drawback related the prior art system of FIGS. 1 and 1a is that prior to the beginning of the shifting of the first sector information, the host need load the buffer with the number of sectors that are to be programmed otherwise, the time to program the sectors increases substantially. This affectively leads to a bigger buffer size, which increases manufacturing costs.

Thus, while such prior art techniques cut the time required for performing sector write operations by processing two sectors at-a-time, additional time, i.e. double the time for shifting sector information, is nevertheless necessary to complete the write operation.

Therefore, the need arises for a method and apparatus to decrease the amount of time associated with a controller device's writing of sector information to nonvolatile memory by performing some of the tasks associated with writing to one sector in-parallel with writing to another sector thereby increasing overall system performance while maintaining the pin-count of the controller device the same and avoiding additional costs in connection with manufacturing of the system.

SUMMARY OF THE INVENTION

Briefly, an embodiment of the present invention includes a nonvolatile memory system for storing sector information in storage locations within nonvolatile memory organized into blocks, a plurality of blocks defining a super block and each block having a predetermined plurality of sectors. The nonvolatile memory system includes a controller for shifting sector information to a first and a second block of a particular super block and writing sector information to a first block of the particular super block, wherein shifting to the second block occurs entirely during the writing to the first block thereby decreasing the time required to perform write operations to blocks and increasing overall system performance.

The foregoing and other objects, features and advantages of the invention will be apparent from the following detailed description of the preferred embodiments which made reference to the several figures of the drawing.

IN THE DRAWING

FIG. 3 shows an example of the organization of blocks within the memory unit 16 of the digital system of FIG. 2.

DETAILED DESCRIPTION OF THE PREFERRED EMBODIMENTS

Figure 1:
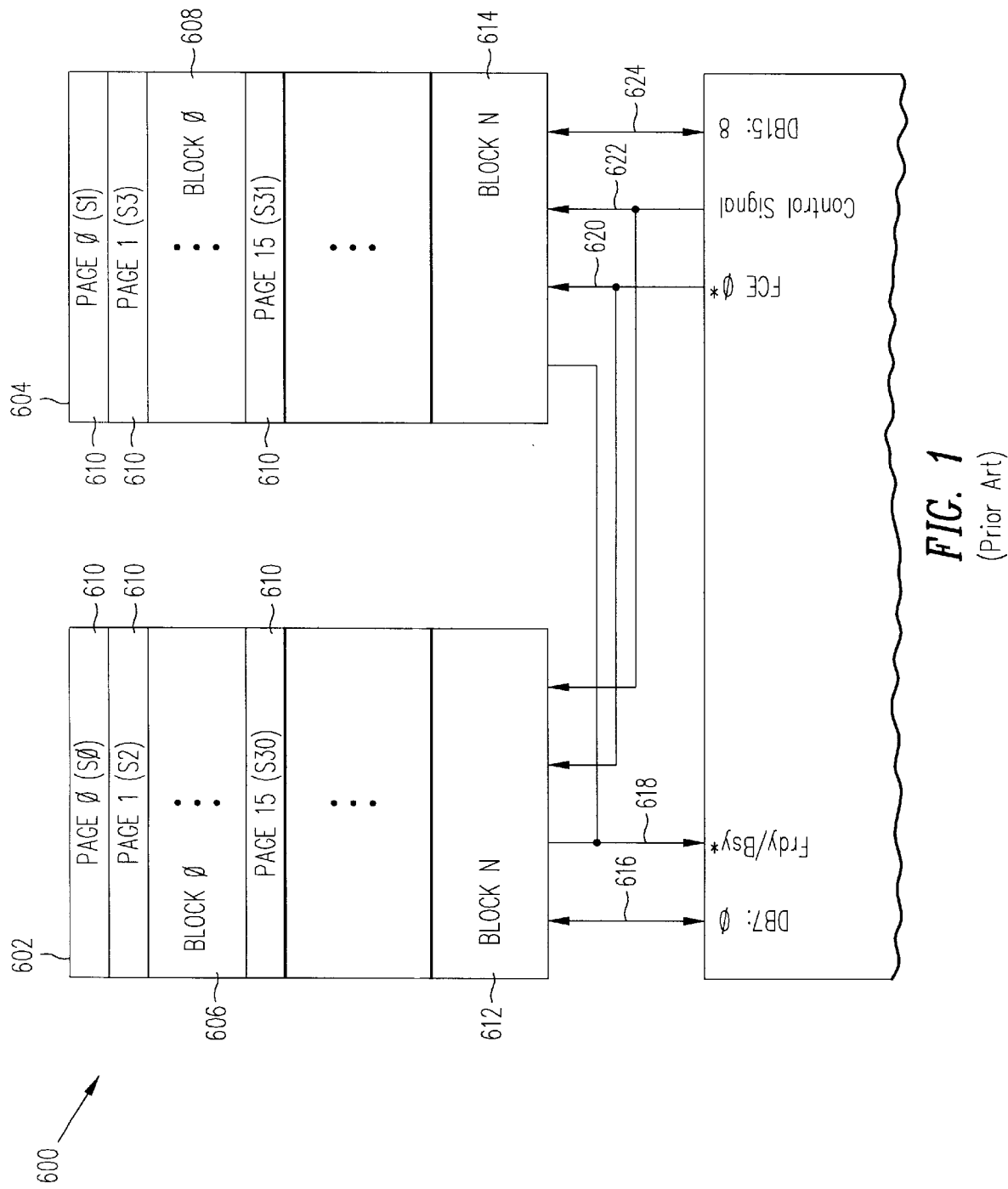
FIG. 1 shows a prior art digital storage sytem employing a 16-bit data bus, DB7:0 and DB15:8 for programming two flash devices in-parallel.
Figure 1A:
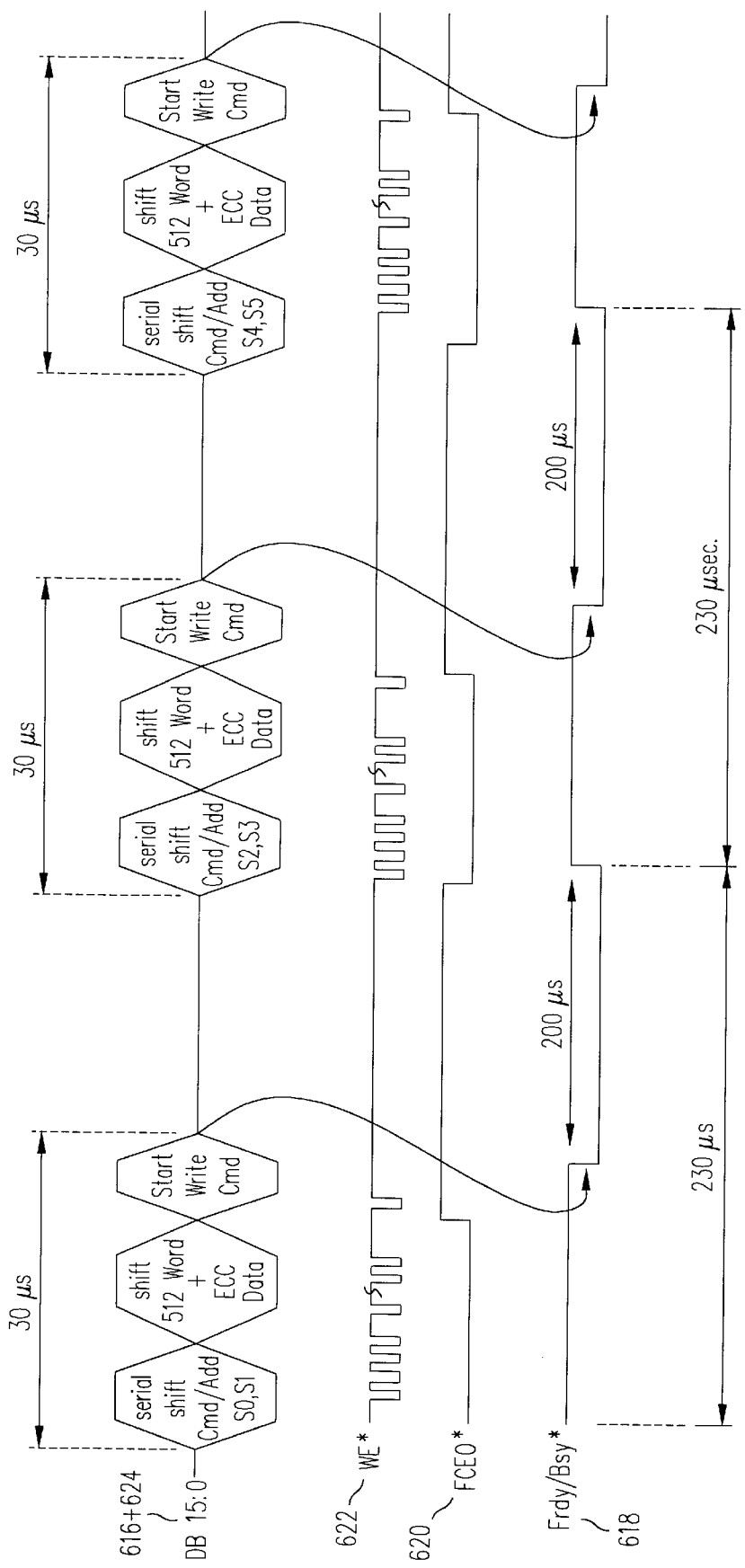
FIG. 1a shows a timing diagram of relevant signals used to program the flash devices of FIG. 1.
Figure 2:
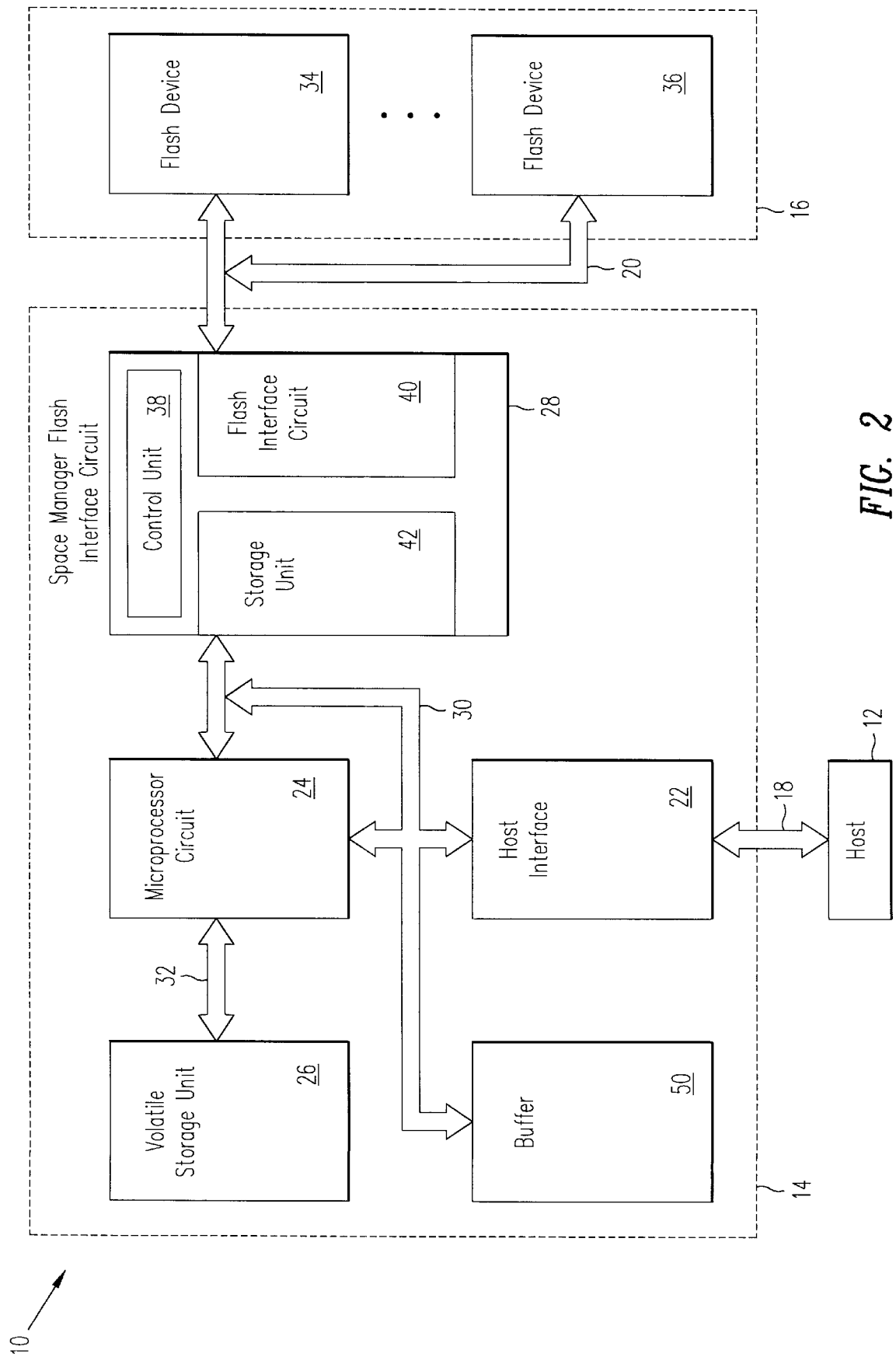
FIG. 2 shows a digital storage system 10 including a memory unit 16 in accordance with an embodiment of the present invention.

Referring now to FIG. 2, a digital storage system 10, which may be a part of a computer (personal computer (PC)), digital camera and the like is shown in accordance with an embodiment of the present invention coupled to a host 12. The digital system 10 includes a controller device 14 and a nonvolatile memory unit 16. The host 12 is coupled to read information from and write information to the memory unit 16 under the direction of the controller device 14. The memory unit 16 is comprised of one or more nonvolatile memory devices (in FIG. 2, two of the memory devices 34 and 36 are shown included in the memory unit 16 although other number of memory devices may be employed) in accordance with the present invention. Each of the nonvolatile memory devices is an integrated circuit (or semiconductor device, as commonly referred to by the industry). The nonvolatile memory devices may be flash, EEPROM (Electronically Erasable Programmable Read Only Memory) or other type of solid state memory.

The host 12 is shown to communicate with the controller 14 through host bus 18 and the controller device 14 is shown coupled to the memory unit 16 through memory signals 20.

The controller device 14 is generally an integrated circuit (or semiconductor) shown to include a host interface circuit 22, a microprocessor circuit 24, a volatile storage unit 26 and a space manager/flash interface circuit 28. In alternative embodiments, the controller device 14 may not necessarily be a semiconductor device and can be formed from digital logic coupled onto a printed circuit board or the like. The host interface circuit 22 is for coupling the host 12 through host bus 18, which includes an address bus, a bi-directional data bus and control signals (not shown separately). Depending on the architecture of the host being employed, the host address and data busses may be comprised of a single bus carrying both address and data information by multiplexing address and data signals onto the same bus. It should be noted that the term bus as used herein includes multiple electrical conductors or signal lines. The host bus 18 may be a PCMCIA interface, an ATA interface or other kinds of interfaces employed by the industry.

The host interface circuit 22 is shown coupled to the host bus 18 and is further shown to be coupled through a microprocessor bus 30 to the microprocessor circuit 24. The microprocessor circuit 24 is further coupled to the space manager/flash interface circuit 28 through the microprocessor bus 30, which facilitates communication of address and data information and control signals therebetween. The microprocessor circuit 24 is coupled to read and write information to the volatile storage unit 26 through a volatile storage bus 32. The host interface circuit 22 is further shown coupled to a buffer unit 50 through the microprocessor bus 30. As will be more apparent shortly, information is communicated between the host 12 and the controller device 14 through the host interface circuit. Sector information, provided by the host 12 for storage within the memory unit 16 or to be transferred to the host 12 from the controller device 14, is stored in the buffer unit 50. The buffer unit 50 is generally formed of one or more random-access-memory (RAM) devices or other similar memory devices. In one embodiment of the present invention, the size of the buffer device 50 is such that it can store four sector-size worth of information with each sector being 512 bytes (of user data). In other embodiments of the present invention, other sizes of the buffer device 50 may be employed without departing from the scope and spirit of the present invention. It should however be noted that the size of the buffer is, in part, a function of the number of flash devices that are being employed. That is, in the example provided hereinbelow with reference to certain figures, two flash devices are employed with a 'super' block including two blocks and with sectors of each flash device being addressed in a ping-pong fashion between the two flash devices. In such a configuration, the size of the buffer 50 need at least include storage space for two sectors (in the case where each sector is 512 bytes, the buffer size need at least be 1024 bytes). In the case where there are, for example, four flash devices being employed (not shown in the following figures), since four sectors in like-locations within a super block are addressed in a ping-pong fashion, the buffer size need at least include storage space for four sectors.

In one embodiment of the present invention, the microprocessor circuit 24 is an Intel 8051 processor, alternatively, the microprocessor unit 24 may be any general-purpose processor unit. The volatile storage unit 26 is generally a read-access memory (RAM) for storing firmware code that is executed by the microprocessor circuit 24. Information between the host 12 and the controller 14 is transferred through the host bus 18 and information between the controller 14 and the memory unit 16 is coupled through the memory signals 20. The memory unit 16 is comprised of two or more nonvolatile memory devices, such as 34 and 36. The size of each of the nonvolatile memory devices 34 and 36 may vary depending on the application of the digital system 10. Nonetheless, this size is generally referred to by bytes where each byte is 8 bits. For example, in one application, the size of the nonvolatile memory unit 16 is 160 MB (mega bytes) together with each flash or nonvolatile memory device being 32 MB. In another application, the size of the nonvolatile memory unit 16 is 80 MB with each flash memory device being 16 MB. The nonvolatile memory devices 34 and 36 are of the memory type that preserve their contents even during a power-down. Typical examples of nonvolatile memory devices are flash or EEPROM devices comprised of floating gate cells and manufactured by companies such as Toshiba, Hitachi and the like.

While not shown in FIG. 2, the space manager/flash interface circuit 28 includes a space manager control unit 38, a flash interface circuit 40 and a space manager storage unit 42. The space manager unit 38, in one embodiment of the present invention, is comprised of a state machine for controlling the information that is stored in a look-up-table (LUT) maintained within the space manager storage unit 42. Alternatively, the functions of the space manager control unit 38 may be performed by other types of hardware and/or software as understood by those of ordinary skill in the art. The space manager storage unit 42 is of a volatile type of memory, such as RAM, for storing block addressing and status information within the LUT.

Still not shown in FIG. 2, the memory signals 20 include a flash address bus, a bi-directional flash data bus and flash control signals. Some of these signals will be further described with respect to other figures included herein.

In operation, the host 12 accesses the memory unit 16 from time to time and during performance of various operations such as reading and writing to the memory unit 16. In doing so, the host 12 provides an address identifying a location for reading or writing of data. The host-provided address is coupled onto the host bus 18 for use by the controller 14 in accessing or reading information to and from the memory unit 16. In one embodiment, the host-provided address is in the form of CHS (cylinder, head and sector). This type of addressing is adopted from systems using hard disks where such an addressing scheme was used to identify a particular location on the disk. With the advent of nonvolatile memory for storage of information however, the CHS address format need be converted to a value for identifying a location within the nonvolatile memory unit. Thus, when a CHS address is coupled onto the host bus 18, the controller 14 converts the same to a logical block address (LBA). The LBA is then coupled through the microprocessor bus 30 for use by the space manager/flash interface unit 28. Alternatively, the host 12 provides an LBA type of address to the controller 14, in which case, while conversion is still performed, it is not a CHS to LBA conversion. The latter conversion merely displaces the LBA, as is also performed when the former conversion, i.e. CHS to LBA, is used. The reader will note that as previously discussed herein, a block is defined to include a predetermined number of sectors, such as 16, 32 or other number of sectors. In yet another embodiment, the host 12 performs conversion of the CHS address to an LBA address, displaces the same and provides the resulting displaced address to the controller 14.

The LBA calculation may be performed by hardware or firmware. In the case where firmware is used to calculate the LBA, the microprocessor 24 performs such function by execution of the firmware code stored in the volatile storage unit 26. In the case where hardware is used to calculate the LBA, a state machine block (not shown in FIG. 2) performs such a calculation.

After calculation of the LBA according to the equation hereinabove, the LBA is translated to a VLBA (Virtual Logical Block Address) value by masking certain least significant bits of the LBA. For example, in the case where 16 sectors per block is employed, the VLBA is calculated from the LBA by a logical 'AND' of the LBA with the hexadecimal value 0x3FFFF0. This essentially results in the LBA being preserved except for the 4 least significant bits thereof. In the case where 32 sectors per block are employed, the VLBA is calculated by a logic 'AND' of the LBA value with the hexadecimal value of 0x3FFFE0, which is effectively masking the 5 least significant bits of the LBA and preserving the remaining bits, and so on. In the case where the concept of 'super block' is employed as will be discussed hereinabelow in detail, the number of masked bits is a function of the size of the 'super block'. That is, as each super block has a number of blocks with each block being defined by a number of sectors, the total number of sectors of the super block dictates the number of bits to be masked to form the VLBA value. The translation of the LBA to VLBA is performed by the space manager/flash interface 28. This translation may be performed by either hardware or software.

In FIG. 2, the VLBA is then coupled onto the microprocessor bus 30 from the microprocessor 24 to the space manager control unit 38 of the space manager/flash interface circuit 28 where it is used to address the LUT (Look-Up-Table) of the space manager storage unit 42. In fact, the VLBA is used to address a particular location of the LUT wherefrom a VPBA (virtual physical block address) is retrieved. It should be noted that a particular LBA value may be used to point to various PBA values. For example, if the host wishes to write to a location that is identified by a particular LBA value, the particular LBA value is then used to look up a VPBA value in the LUT. This VPBA value may be, for example, '20' but the next time the host wishes to write to the same LBA-identified location, the VPBA value retrieved from the LUT may be '200' rather than '20'. The way in which this is done is with the use of certain flag information that is also maintained within the LUT. Briefly, the first time after an erase operation that a particular LBA location is being addressed by the host for writing thereto, the information is written and a flag field within the LUT corresponding the particular LBA is marked as 'used' so that the next time the host wishes to write to that same location prior to an erase operation, a different location within the memory unit 16 is identified by a different PBA for such writing. Accordingly, there is no one-to-one relationship between the LBA and the PBA. For further explanation of flag fields and the LBA and PBA LUT addressing, the reader is directed to a U.S. Pat. No. 5,907,856 issued on May 25, 1999, entitled "Moving Sectors Within a Block of Information in a Flash Memory Mass Storage Architecture", the inventors of which are Petro Estakhri, Berhanu Iman and Ali R. Ganjuei and the disclosure of which is herein incorporated by reference as though set forth in full.

In PC applications, a block of information is typically a sector as employed in conventional hard disk drives, with each sector typically including space for 512 bytes of data and additional space for overhead information, although other-sized sectors may be similarly employed.

Microprocessor 24 executes instructions in the form of program code from the volatile memory unit 26 (such as ROM (read-only memory) or RAM (read-and-write memory)) located either within or outside of the microprocessor 24. The microprocessor 24 further instructs the space manager control unit 38 to use the LBA, originated by a CHS value provided by the host, to find the next unused (or free) addressable storage block location available within the memory unit 16. During a host write operation, this unused block location is stored in the LUT and during a host read operation, this block location is read from the LUT. The address value identifying a location within the memory unit 16, as stored within the LUT, is referred to as a Virtual Physical Block Address (VPBA). The space manager control unit 38 may employ any one of a variety of algorithms to find the next available (or free) block located within the flash memory devices. An example of a space manager is disclosed in an earlier-issued patent, U.S. Pat. No. 5,924,113, entitled "Direct Logical Block Addressing Flash Memory Mass Storage Architecture", issued on Jan. 13, 1999 with the inventors being Mahmud Assar and Petro Estakhri, the disclosure of which is herein incorporated by reference as though set forth in full. The reader is particularly directed to FIGS. 11–13 and discussions regarding the same. In alternative embodiments, however, other space management methods and apparatus may likewise be employed by the present invention.

The VLBA value is ultimately used to look up a VPBA value from the LUT. The LUT is comprised of rows and columns with each row being addressed by a VLBA value. During a read operation, the VLBA value is used to address a particular row of the LUT for retrieving therefrom, the VPBA. During a write operation, the VLBA is used to address a particular row of the LUT for storing a VPBA value including certain flag information. The VPBA is ultimately translated to a Physical Block Address (PBA) for identifying a particular sector location within the memory unit 16.

The LBA value is coupled onto the microprocessor bus 30 by the microprocessor 24 for use by the space manager/flash interface 28 where it is translated to a VLBA address. Four bits of sector indicates the use of 16 sectors per block since 2 to the power of 4 equals 16. The VLBA is derived by masking the sector bits (the masked sector bits will be referred to as sector offset value), which in this example include 4 bits. The block and chip select information remain the same. The chip select bits are used to select a particular one of the plurality of nonvolatile memory devices included within the memory unit 16, such as one of the devices 34 or 36. The block information identifies a particular block within the selected nonvolatile memory device. The VLBA is also written to the nonvolatile memory as the block is stored, written or moved in the nonvolatile memory. That is, the VLBA is written in the last row of the block. Alternatively, the VLBA may be written to any of the other rows of the block. This will be further explained with respect to the following figures.

Referring now to FIG. 3, the memory unit 16 is shown to include a flash device 200 and a flash device 202, each of which is a semiconductor device. As earlier noted, the memory unit 16 may include more or less flash memory devices. It should be understood that in FIG. 3, each flash device 200 and 202 is shown to include information that is organized in blocks, starting from Block 0 to Block N with each set of blocks, Blocks 0–N, being included within one flash device.

Figure 4B:
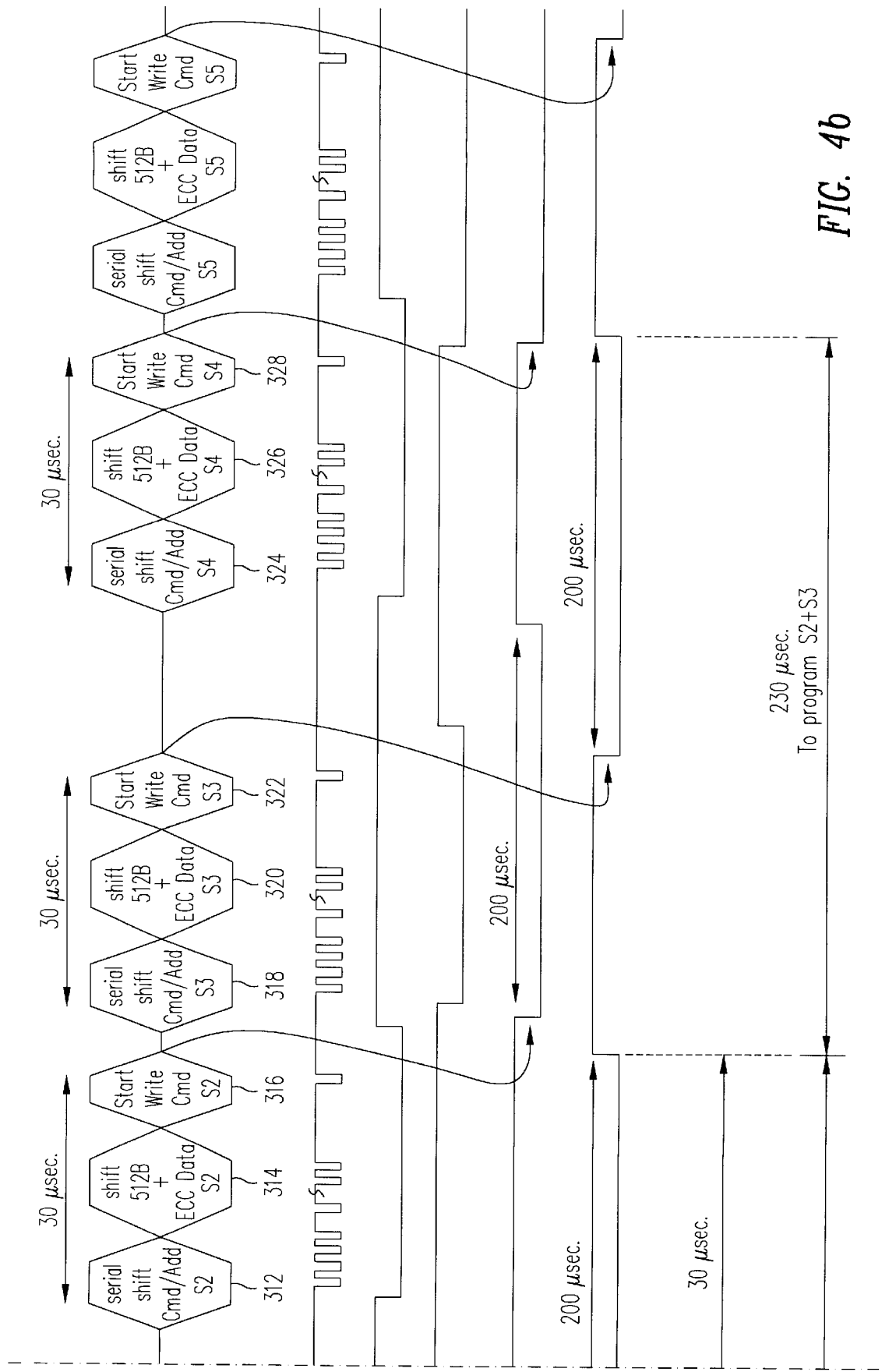
FIG. 4 depicts a timing diagram for the programming of sector information for the example of FIG. 2.

In FIG. 3, the flash device 200 is shown to include N blocks (N being an integer number), specifically Block 0 210, Block 1 212 to Block N 214. Similarly, the flash device 202 is shown to include N blocks, specifically, Block 0 216, Block 1 218 to Block N 220. The flash devices 200 and 202 communicate to the controller device 14 (shown in FIG. 2) through the memory signals 20. The memory signals 20 are shown to include a data bus, DB7:0 242, control signals 240, which include signals for reading, writing and erasing, a flash ready/busy (Frdybsy*) bus 222, a flash chip enable 0 (FCE0*) signal 224 and a flash chip enable 1 (FCE1*) signal 226. The Frdybsy Bus 222 includes a flash ready/busy 0 (Frdy/bsy0*) signal 228 for indicating when the flash device 200 is ready to be programmed or alternatively busy and a flash ready/busy 1 (Frdy/bsy1*) signal 230 for indicating when the flash device 202 may be programmed and when it is busy and thus cannot be programmed. The FCE0* signal 224 is used to enable the flash device 200 prior to a write, read or erase operation. Similarly, the FCE1* signal 226 is used for enabling the flash device 202 prior to a write, read or erase operation. The signals included within the memory signals 20 are developed by the controller device 14. In one embodiment of the present invention, the FCE0* and FCE1* signals are active low, that is, they are active when their state is a low voltage or approximately '0' volts. When at the latter state, these signals cause the corresponding flash device to be activated or ready to be written thereto. Similarly, when the Frdy/bsy0* and Frdy/bsy1* signals are low, this indicates that their corresponding flash device is busy (or being programmed, read or erased) whereas if these signals are 'high' (a voltage level that is at a substantially higher potential than a 'low' voltage level), their corresponding flash device is ready for programming. This is an arbitrary design choice in that these signals may be configured to be active high or of opposite polarity than that which is indicated in the example of FIGS. 3 and 4.

The bus DB7:0 242 is used to couple data to be programmed into or read from the flash devices. The 242 bus is an eight-bit bus in one embodiment of the present invention and may be other number of bits alternatively. The 242 bus is connected to both of the flash devices 200 and 202. The states of the FCE0* and FCE1* signals along with states of other control signals indicate which flash device data is being read from or written thereto. For example, if the FCE0* is 'low' and the WE* signal (a signal not shown in FIG. 3 but included in the control signals 240 as will be shown in FIG. 4) is low, the flash device 200 will be programmed with the information that is coupled onto the bus 242 and even though the bus 242 is connected to the flash device 202, the latter will not be programmed because its flash enable, or the FCE1* 226 is 'high' and not active. Each of the blocks of the flash device 200, Block 0–N, 210–214, and each of the blocks of the flash device 202, Blocks 0–N, 216–220, are shown to include 16 sector storage locations 232 for storing sector information including user data and ECC information (and alternatively other types of overhead information). It should be noted that in alternative embodiments, each of the blocks (210–214 and 216–220) may include other than 16 sectors. For example, in a system having memory unit of capacity 128 Mbits, there may be 32 sectors used per block whereas using a capacity of 64 Mbit requires 16-sector blocks.

Two blocks in like locations within the flash devices 200 and 202 form a 'super block'. For example, as shown in FIG. 3, a super block 0 204 includes Block 0 210 of flash device 200 and Block 0 216 of flash device 202. A super block 1 206 is shown to include the Block 1 212 of flash device 200 and the Block 1 218 of flash device 202 and a super block N 208 is shown to include the Block N 214 of flash device 200 and the Block N 220 of flash device 202. While a super block is shown to include two blocks, one from each flash device, alternatively, a super block may include more than two blocks and if so, a super block will include blocks situated in like locations within each of the flash devices. Alternatively, Blocks 0–N of the flash device 200 and Blocks 0–N of the flash device 202 may be included in the same semiconductor device.

In operation, upon command from the host 12 (shown in FIG. 2), sector information is written by programming the first sector storage location 232 (S0) of the Block 0 210 of the flash device 200. However, being that typically, more than one sector of information is stored within the memory unit 16, the next sector information is then stored in the first sector storage location 232 (S1) of the Block 0 216 of the flash device 202. The next sector information is stored in the second sector storage location (S2) of the Block 0 of the flash device 200 and the following sector information is stored in the second sector storage location (S3) of the Block 0 216 of the flash device 202 and so on. Accordingly, 32 sectors of information may be stored within a super block. This effectively increases the programmability size of a block relative to prior art in that in the prior art, a block of each flash device is programmed followed by another block and so on. The configuration of the present invention allows for overlapping of tasks associated with effectuating a write operation to a super block, as will be apparent shortly, in a manner so as to decrease the amount of time associated with writing sector information and thus increasing overall system performance.

When a particular sector storage location or block is being programmed (or written thereto), the FCE signal corresponding to the flash device in which the particular sector storage location resides is enabled and the Frdybsy is programmed to indicate that the flash device is busy so as to avoid any further operations on the flash device until the write operation is completed. To write to a particular sector storage location, a particular flash device is selected (or enabled by activating its corresponding FCE signal), a write command is shifted into a shift register (not shown) within the particular flash device in which the particular sector storage location is located. Next, the sector information that is to be stored is shifted into the flash device and thereafter the write command is started and the sector information is programmed into the particular flash device. During the latter task, i.e. when sector information is actually being written into the flash device, the Frdybsy signal corresponding to the particular flash device is programmed by the controller to indicate that the particular flash device is busy and this process typically takes 200 μsec. to complete for a sector size of 512 bytes. The shifting of sector information into the flash device for a sector size of 512 typically consumes 30 μsec.

Referring now to FIG. 4, a timing diagram reflecting the sequence of events for programming (or writing to) the flash devices 200 and 202 is shown. Specifically, programming of six sectors, S0 and S1, S2, S3, S4 and S5 is shown with reference to the states of the Frdy/bsy0* 228 signal, the Frdy/bsy1* 230 signal, the FCE0* signal 224, the FCE1* 226 signal and the WE* signal, the latter being included in the control signals 240 (shown in FIG. 3). As will be apparent shortly, programming of one of the flash devices is performed concurrently with shifting of the sector information into the other flash device so as to make the shifting operation transparent-in-time relative to the performance of the write operation thereby increasing the speed of the write operation for two sectors-at-a-time while employing one data bus. This effectively introduces a pipelining of tasks associated with programming two sectors and thus decreases sector information write operation time.

The bus 242 is coupled with different information at various times and such information is shown, in relevant part, at the top of FIG. 4. Starting from the left side of FIG. 4, the bus 242 carries command and address information for sector S0 and this information is shifted into the flash device 200, as shown at 300. Command in this case is a write command, generally initiated by the host and the address information is the address of the particular sector in which the sector information is to be programmed (the address of the sector S0). During shifting of the command/address information, each bit thereof is shifted serially into the flash device 200. With each occurrence of the WE* signal going to a 'low' state, a bit of information is shifted. Meanwhile the FCE0* signal 224 is held low to select the flash device 200 for shifting. At 302, the sector information, specifically, the user data, which is typically 512 bytes, error correction code (ECC) information and potentially other sector overhead information, is shifted into the flash device 200 for S0, 8 bits at-a-time. Again, a series of WE* low-going pulses effectuate shifting of the sector information into the flash device 200 and the FCE0* signal 224 remains 'low' to enable the flash device 200.

At 304, the write command is started and with the occurrence of the WE* signal going from a low state to a high state, the FCE0* signal 224 goes to a high state and the Frdy/bsy0* 228 signal goes to a low state thus beginning actual programming (or writing) of sector information into the flash device 200. This programming is of S0 sector information, which in FIG. 3 would be the first sector of Block 0 of the flash device 200. It is the inventor's experience that the length of time to program 512 bytes of sector user data and 12 bytes of ECC information is approximately 200 μsec. and the shifting and start write command operations consume approximately 30 μsec. At the time sector information is shifted into a flash device, it is yet not programmed, rather, the information is placed into a temporary holding register awaiting programming thereof, whereas, when information is written to a flash device, the cells of the latter are actually being programmed. Moreover, programming of a flash device takes place when its corresponding Frdy/bsy* signal is at a 'low' state.

At the end of the start write operation, at 304, the FCE0* signal 224 is taken to a 'high' state by the controller device 14 so as to prevent shifting of any new sector information prior to the current sector information being written to the flash device. While the flash device 200 is being written thereto, the FCE1* signal 226 is taken to a low state at 306 and through the generation of a series of WE* pulses, command and address information is shifted serially for sector S1 into the flash device 202. Next, at 308, the sector information, i.e. 512 bytes of user data and 12 bytes of ECC, is shifted into the flash device 202 through the generation of a series of WE* pulses. The FCE1* signal 226 remains low for this shifting process. The shifting and start write command operation (310) for S1 also consumes approximately 30 μsec. It is important to note that the shifting of S1 sector information takes place during the time that sector information is being programmed into sector S0 of the flash device 200. Essentially, this renders the 30 μsec. of shift time transparent as it is being done in parallel or concurrently with the writing of sector information into another flash device. Thus, writing to a super block having 32 sectors, in the present invention, consumes 30+30+200 or 260 μsec. for programming of the first two sectors and thereafter only 230 μsec since shifting time of one of the sectors is always transparent after the first shift. As is understood by those skilled in the art, the write operation time is decreased by the present invention without having to double the data bus and thus add pin-count to the controller device. That is, in the present invention, a data bus of eight bits is employed, whereas, the best scenario that prior art offered relative to write operation time needed sixteen bits of data bus. Moreover, in the present invention, a super block may include more than two blocks or 32 sectors and in this case, again, the number of requisite pins relative to the data bus remains the same while the write operation time improvement remains the same. That is, in the prior art, a data bus of 32 bits is required to achieve a write operation time of 230 μsec. for two sectors, whereas, the same write operation time is achieved with the present invention without the need to increase the data bus pin-count to more than 8 bits. Indeed, as the number of blocks per super blocks increase and more flash devices are programmed in-parallel, the more advantage offered by the present invention. If enough flash devices are placed in-parallel, there will not be enough space for the number of extra data bus pins required such that the method and technique of prior art systems using additional data bus lines becomes impractical.

In some prior art techniques, a write time of 30+30+200+ 200 or 460 μsec. is required and in certain other prior art techniques, such as discussed, at length, hereinabove, where 230 μsec. can be achieved, there is a latency delay that far exceeds that of the present invention thereby resulting in a decreased write performance by the former. To reiterate, the latter prior art techniques require that the sectors of the block be stored in the buffer prior to each block write operation. In the case where a block is 32 sectors and assuming programming of four sectors, all four sectors need be stored in the buffer, which requires the buffer size to be larger than that which is required by the present invention thereby increasing manufacturing costs of prior art systems. Otherwise, if only two sectors of information are stored in the buffer, there is a substantial latency associated with having to wait for the host to provide and the controller to store the next two sectors in the buffer before programming of the latter can begin. This effectively lengthens the time associated with a two-sector write operation to over 230 μsec. This is, in part, due to the prior art methods and apparatus failure to hide the sector (command, address, data and ECC) shift time.

Referring still to FIG. 4, at 310, the write command for S1 is started causing the WE* signal to go low. When the WE* signal goes high again, the Frdy/bsy1* 230 is caused to go low thereby starting programming of sector information into the sector S1 of the flash device 202. Again, the latter process consumes 200 μsec. for a 512 Byte-sector. The Frdy/bsy1* stays low for approximately 200 μsec. The total programming time for writing to sectors S0 and S1 is then 230 μsec. There is an additional 30 μsec. associated with shifting of the first sector information such that shifting and programming of the first two sectors (in this example, sectors S0 and S1) requires 260 μsec. Thereafter, shifting and programming of two sectors requires only 230 μsec. because as will be shortly apparent, the shifting of one of the sectors is buried within the write time of the other sector. While at first impression, write operation time for the first two sectors, i.e. 260 μsec. appears to be more than the write operation time associated with some of the prior art systems discussed hereinabove, there is actually an overall decrease in programming using the present invention. This is due to the requirement for prior art systems to have the host send the sectors that are to be programmed in-parallel to the controller for storage into the buffer prior to the beginning of the shift and write time. Thus, the write process is placed on hold while the host completes the above and generally, host write operations are known to be slow therefore increasing the time associated with the overall programming of sectors. In the present invention however, there is no need to wait for the host to provide a pre-requisite number of sectors before the beginning of writing of any two sectors except for the first time two sectors are being written. That is, initially, the host need provide two sectors of information to the controller for storage into the buffer. Thereafter, the host may provide sector information as other sectors are being programmed. It should be noted that in systems employing fast hosts, this difference between the present invention and the prior art may not have an exaggerated effect. However, in systems where a slower host in employed, which is generally the case partly due to cost constraints, this difference is well-noted.

In FIG. 4, at 312, 314 and 316, command and address information is shifted into the flash device 200 serially, sector information is shifted into the flash device 200 and the write command is started much in the same way as that described hereinabove except it is done this time for sector S2. In FIG. 3, S2 is shown to be the second sector in Block 0 of the flash device 200. The shifting of sector information at 314 takes place during writing of sector information into the sector S1 of flash device 202. Again, this hides the time associated with shifting of sector information and thus reduces this sector's write time by approximately 30 μsec. For larger sized sectors (larger than 512 bytes), there is additional saving of time.

With the completion of the start write command at 316 and the WE* signal going from low to high, the programming of sector information into the S2 sector is started as the Frdy/bsy0* signal 228 is caused to go to a low state and the sector information is programmed into the flash device 200 during approximately the next 200 μsec. Next, command and address information for the sector S3 is shifted serially into the flash device 202 at 318. At 320, sector information is shifted into the flash device 202. As noted earlier, these shifting operations occur in conjunction with the writing of sector information into the S2 sector causing the time associated with the shifting of sector information, command and address to be hidden or transparent to the overall write operation. Accordingly, the process continues until all of the sectors that have been designated by the host to be programmed are so programmed. The process continues in the same manner for sectors S4 and S5.

It is understood that in the present invention, as soon as the host has provided sector information for one sector and the same is stored in the buffer, the controller 14 begins the sector write operation. Accordingly, there is no need to wait for two or more sectors of information from the host prior to the beginning of the write operation, as required by prior art systems. Thus, latency caused by waiting for the host to provide two or more sector information prior to writing is reduced by the present invention.

Figures 5, 5A:
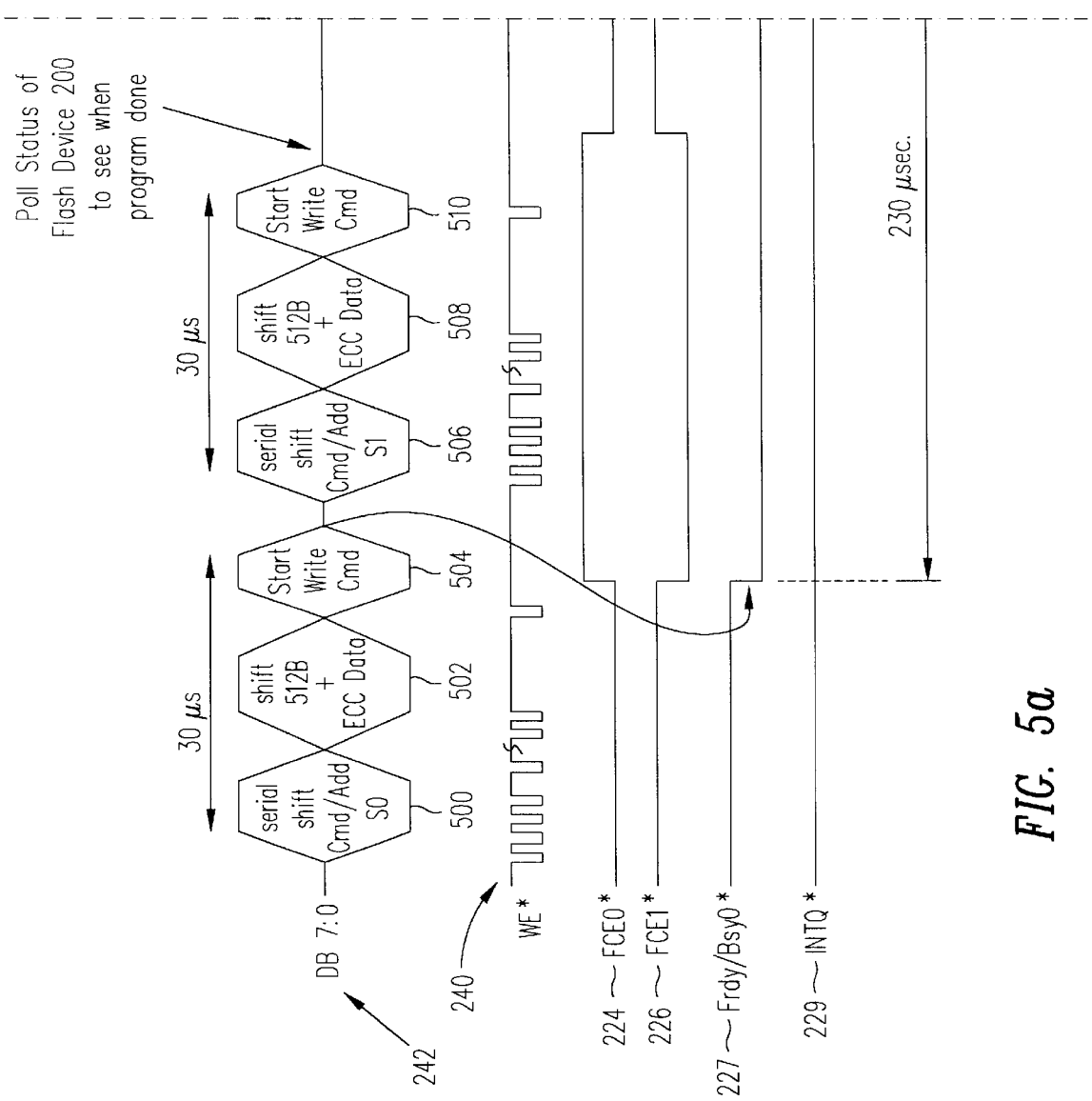
FIG. 5 illustrates a timing diagram of an alternative embodiment of the present invention.
Figure 5B:
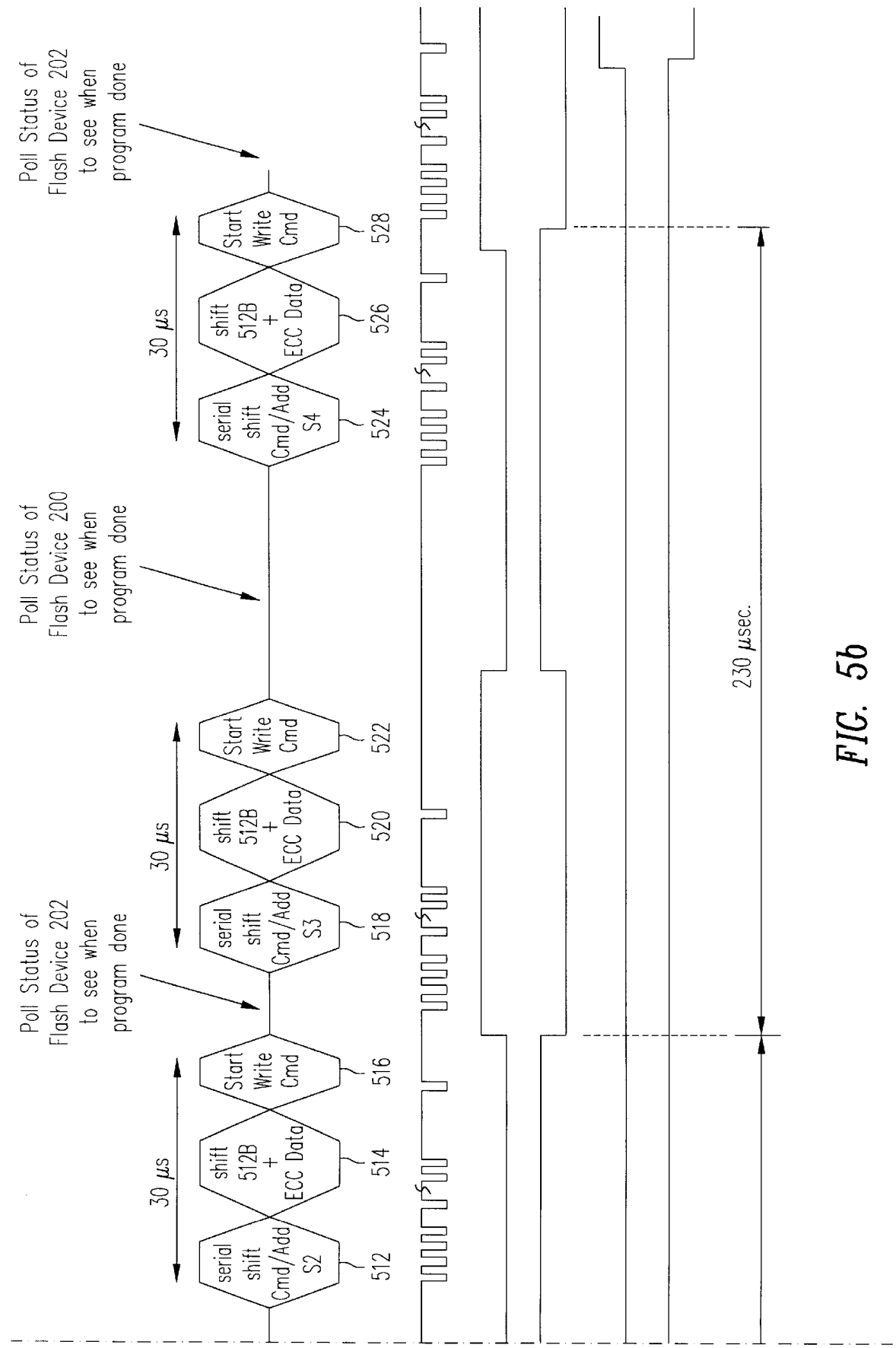

FIG. 5 shows a timing diagram of an alternative embodiment of the present invention wherein one Frdy/bsy* signal is used for all flash devices. Additionally, in another aspect of the present invention, an interrupt signal is used to announce the occurrence of one or more errors when programming sectors. In the latter case, it should be understood that due to the sensitivity associated with programming of flash cells, typically a read-verify operation is performed every a sector is programmed to confirm successful programming thereof. In prior art systems, as no interrupt signal is employed, after the completion of a sector write operation, the flash device that included the sector being programmed must be polled to determine whether or not an error occurred in programming the flash device. This is an added step to the overall write operation that is essentially eliminated by the use of an interrupt signal.

In FIG. 5, the timing of an Frdy/Bsy0* signal 227 is shown. This signal replaces the use of multiple Frdy/Bsy signals (one for each flash device) and is shared by all flash devices. Accordingly, the signal 227 goes low after the stare write command 504 for the first sector, S0, and remains low the entire time during which the flash devices are programmed. As in earlier embodiments, the shifting of sector information for one of the sectors being programmed takes place during programming of the other sector. However, because other Frdy/bsy* signals are not being employed, the signal 227 remains low during programming of all sectors, which takes the same amount of time as that discussed relative to FIG. 4, i.e. 230 μsec. for programming of two sectors and 260 μsec. for programming of the first two sectors.

An INTQ* signal 229 is developed by the flash devices. The signal 229 is an open-collector signal that is connected to all of the flash devices of the memory unit 16 (shown in FIG. 2). When an error is detected by any of the flash memory devices, i.e. there is a mismatch between the sector information that was programmed and that which was intended to be programmed, the signal 229 is driven to active state (in this example, the active state is a logic 'low') and serves as an input to the controller device 14 for notifying the latter of any errors that may have arisen during programming of a flash device. In prior art systems, as noted earlier, each time after a sector has been programmed, the flash device containing the programmed sector is checked for accuracy. This is done by checking the state of a predetermined status register.

In practice, the flash device performs a read-verify operation wherein the information that was programmed in the sector is read back and thereafter, a read-status command is executed by the controller. If this read information does not match that which was programmed, an error is detected. In prior art systems, the status of the write operation is polled by checking a status register, during the read-status operation, to determine whether or not there was a problem in programming the sector after each sector write operation (these times are noted in FIG. 5). However, in accordance with an embodiment of the present invention, the INTQ* signal 229 eliminates the need to poll status information because if the read-verify operation reports an mismatch between the read sector and that which was intended to be programmed, the signal 229 is activated to notify the controller of the error. In this respect, one embodiment of the present invention reduces the tasks performed by the microprocessor 24 (shown in FIG. 2) since in prior art systems, it is the microprocessor that checks the status register for programming errors. The present invention, thus, effectively increases the overall performance of the system by allowing the microprocessor to tend to other functions.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A nonvolatile memory system for storing sector information in storage locations within nonvolatile memory organized into blocks, a plurality of blocks defining a super block and each block having a predetermined plurality of sectors comprising:

controller for shifting sector information for a first sector of a first block of a particular super block, said controller further for shifting sector information for a first sector of a second block fo the particular super block and for writing sector information to the first sector of the first block of the particular super block, wherein shifting for the first sector of the second block occurs entirely during the writing to the first sector of the first block thereby decreasing the time required to perform write operations to blocks and increasing overall system performance.

2. A nonvolatile memory system as recited in claim 1 wherein said controller for receiving an Frdy/bsy* signal from the nonvolatile memory for causing writing of sector information to said second block of the particular super block to take place when said Frdy/bsy* is active.

3. A nonvolatile memory system as recited in claim 1 wherein said controller being coupled to a first flash device and a second flash device, said first and second flash device being included withn the nonvolatile memory unit.

4. A nonvolatile memory system as recited in claim 3 wherein said first flash device includes the first block of the particular super block and said second flash device includes the second block of the particular super block.

5. A nonvolatile memory system as recited in claim 4 wherein said first and second blocks of the particular super block are in like-locations the first and second flash devices.

6. A method for writing sector information to nonvolatile memory organized in blocks, a plurality of blocks defining a super block and each block having a predetermined plurality of sectors comprising:

shifting sector information for a first sector of a first block of a particular super block;

shifting sector information for a first sector of a second block of the particular super block; and writing sector information to the first sector of the first block of the particular super block while performing said shifting step for the second block thereby decreasing the time required to perform write operations to blocks and increasing overall system performance.

7. A nonvolatile memory system for storing sector information in storage locations within nonvolatile memory organized into blocks, a plurality of blocks defining a super block and each block having a predetermined plurality of sectors comprising:

a controller for writing sector information to a particular super block and responsive to an interrupt signal from the nonvolatile memory indicative of whether or not the writing of sector information is successful, wherein said interrupt signal avoids polling for status information thereby decreasing the time associated with performing writing sector information.

8. A nonvolatile memory system as recited in claim 7 wherein said controller further for shifting sector information for a first sector of a first block of a particular super block, said controller further for shifting sector information for a first sector of a second block of the particular super block and for writing sector information to the first sector of the first block of the particular super block, wherein shifting for the first sector of the second block occurs entirely during the writing to the first sector of the first block thereby decreasing the time required to perform write operations to blocks and increasing overall system performance.

* * * * *